(12) United States Patent
Okamura (10) Patent No.: US 7,158,441 B2
(45) Date of Patent: Jan. 2, 2007

(54) SEMICONDUCTOR INTEGRATED CIRCUIT (75) Inventor: Junichi Okamura, Yokohama (JP)

(73) Assignee: Thine Electronics, Inc., Tokyo (JP)

( * ) Notice: Subject to any disclaimer, the term of this patent is extended or adjusted under 35 U.S.C. 154(b) by 191 days.

(21) Appl. No.: 11/008,957

(22) Filed: Dec. 13, 2004

(65) Prior Publication Data

US 2005/0104673 A1    May 19, 2005

Related U.S. Application Data

(63) Continuation of application No. 10/333,010, filed on Jan. 15, 2003, now abandoned.

(51) Int. Cl.
*G11C 8/00* (2006.01)
*G11C 7/00* (2006.01)

(52) U.S. Cl. .................. 365/233; 365/194; 327/295; 331/49

(58) Field of Classification Search .............. 365/233, 365/194; 327/295, 274; 331/49, 34
See application file for complete search history.

(56) References Cited

U.S. PATENT DOCUMENTS 5,596,302 A * 1/1997 Mastrocola et al. .......... 331/57

5,777,567 A * 7/1998 Murata et al. .............. 341/100

FOREIGN PATENT DOCUMENTS

| JP | 59-63822 A | 4/1984 |
|---|---|---|
| JP | 06-152347 A | 5/1994 |
| JP | 11-150446 A | 6/1999 |

* cited by examiner

*Primary Examiner*—Son T. Dinh
(74) *Attorney, Agent, or Firm*—Sughrue Mion, PLLC (57) ABSTRACT

A semiconductor integrated circuit in which multiphase clock signals having the same phase difference are supplied from a multi-stage differential ring oscillator to other circuits, the multiphase clock signals can be prevented from being degraded in waveform due to electrostatic coupling between wirings of the multiphase clock signals and also wired in as small an area as possible. The semiconductor integrated circuit includes: multiple stages of amplifier circuits, connected in a ring form, for performing oscillating operation; a logic circuit for performing logic operation on the basis of predetermined ones of output signals of the multiple stages of amplifier circuits to output a plurality of clock signals having different phases from each other and duties not equal to 0.5; and a plurality of wirings for transmitting the plurality of clock signals output from the logic circuit.

18 Claims, 12 Drawing Sheets

SEMICONDUCTOR INTEGRATED CIRCUIT

This is a continuation of application Ser. No. 10/333,010 filed Jan. 15, 2003 now abandoned. The entire disclosure of the prior application, application Ser. No. 10/333,010 is hereby incorporated by reference.

TECHNICAL FIELD

The present invention relates generally to a semiconductor integrated circuit and more particularly to a semiconductor integrated circuit including a differential ring multiphase oscillator.

BACKGROUND ART

For signal transmission among devices, a technique employing high-speed and small-amplitude serial signals has been in use in recent years. Compared with a technique that transmits digital signals in parallel, this technique needs only a small number of cables and also can minimize electromagnetic interference (EMI) caused by the digital signal transmission.

To realize a high-speed serial communication, a parallel-serial converter is required on a transmit side which converts parallel data into serial data by using sub-clock signals having multiple phases (hereinafter, such clock signals are referred to as multiphase clock signals). The multiphase clock signals are synchronous with a base clock signal and have the same phase difference. Further, a multiphase clock generator is required which generates the multiphase clock signals and supplies them to the parallel-serial converter.

An example of the multiphase clock generator is a voltage-controlled or current-controlled differential ring oscillator having multiple stages of delayed differential inverted amplifiers connected in a ring form. By using such a ring oscillator, it is possible to easily draw multiphase clock signals having the same phase difference out of the multi-staged amplifiers. However, in the case of designing wiring layout for the multiphase clock signals having precisely equal phase differences from the high-speed ring oscillator to the parallel-serial converter, the influences of electrostatic coupling between different wirings must be made uniform.

Figure 1:
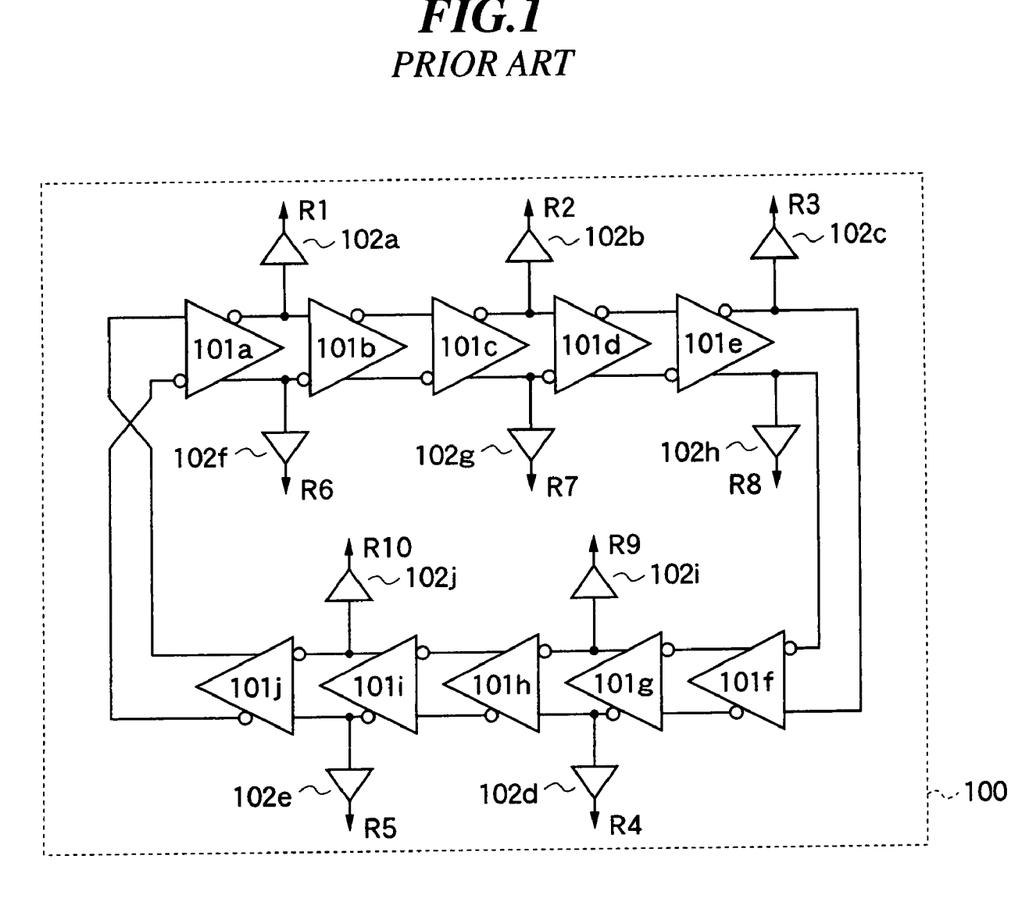
FIG. 1 is a circuit diagram showing a configuration of a voltage-controlled differential ring oscillator used in conventional semiconductor integrated circuits.

FIG. 1 shows a voltage-controlled differential ring oscillator used in conventional semiconductor integrated circuits. As shown in FIG. 1, the voltage-controlled differential ring oscillator 100 includes N stages of delayed differential inverted amplifiers 101a–101j which perform oscillating operation and output amplifiers 102a–102j which buffer output signals of the delayed differential inverted amplifiers 101a–101j to output multiphase clock signals. Shown here is a case of N=10. The output amplifiers 102a–102j buffer oscillation signals output from every other delayed differential inverted amplifiers 101a–101j connected in a ring form and supply them as multiphase clock signals R1–R10 to the parallel-serial converter.

Figure 2:
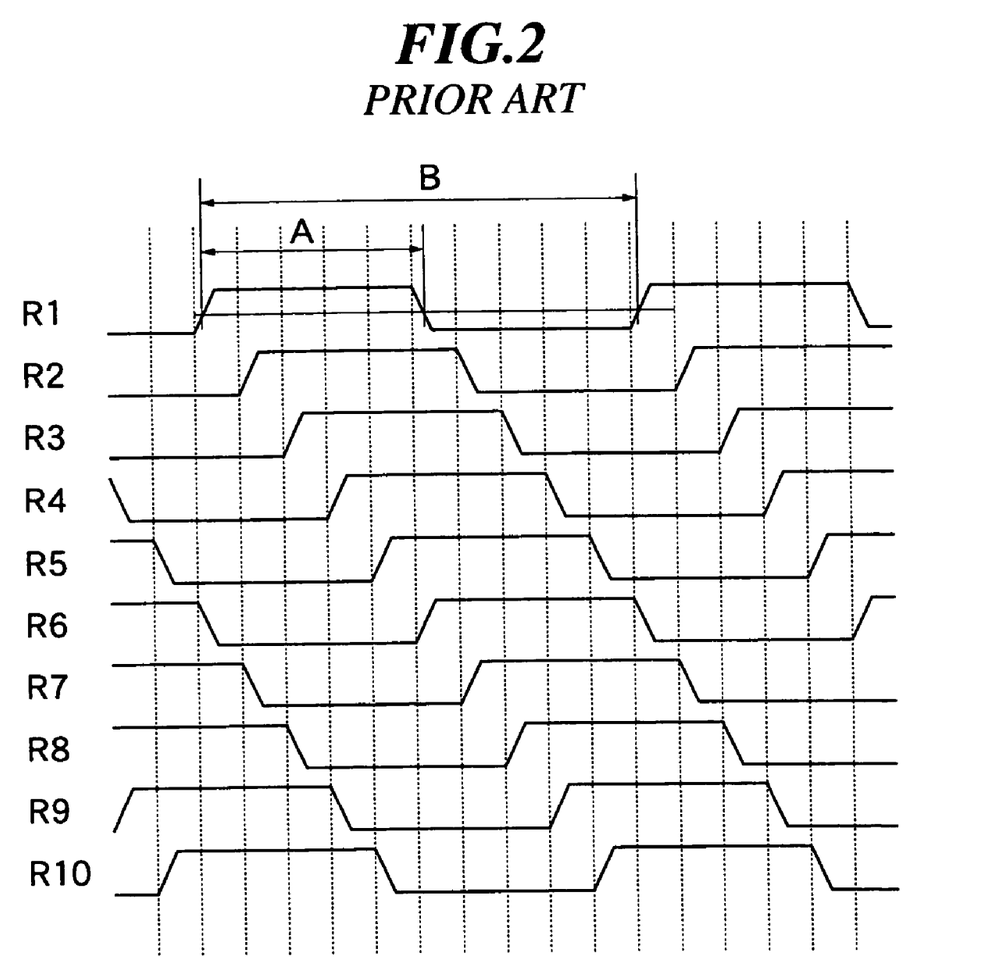
FIG. 2 is a waveform diagram showing voltage waveforms of multiphase clock signals output from the voltage-controlled differential ring oscillator as shown in FIG. 1.

FIG. 2 shows voltage waveforms of the multiphase clock signals R1–R10 output from the voltage-controlled differential ring oscillator as shown in FIG. 1. In FIG. 2, an abscissa represents time and an ordinate represents voltage. When we let "A" stand for a duration in which each clock signal is a high level and "B" for a cycle of the clock signal, a duty of each clock signal is set at D=A/B=0.5.

Figure 3A:
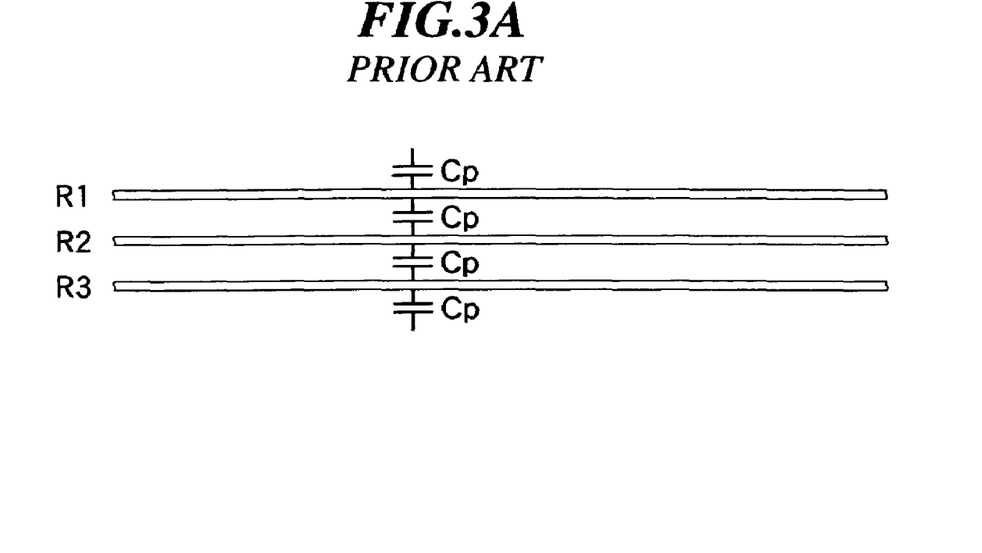
FIG. 3A is a schematic diagram showing multiphase clock signal wirings in a conventional semiconductor integrated circuits and equivalents of stray capacities between these wirings.
Figure 3B:
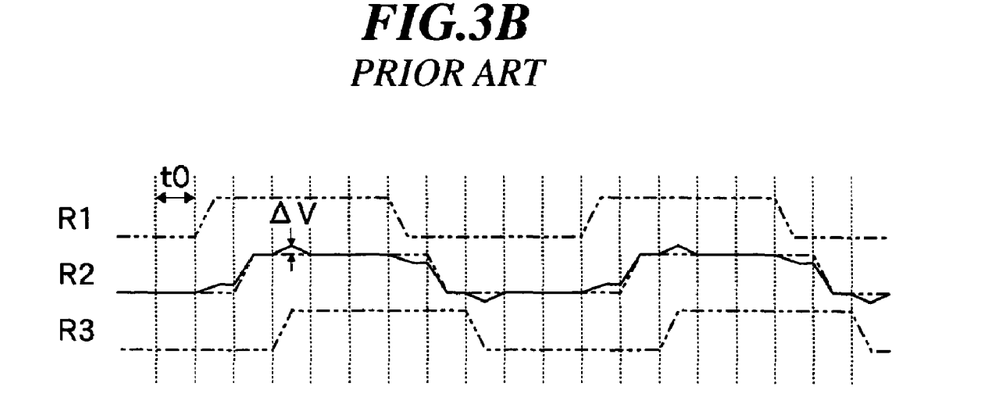
FIG. 3B is a waveform diagram showing how the voltage waveform of a clock signal is degraded by crosstalk due to the stray capacity.

FIG. 3A shows wirings or interconnects for three clock signals R1, R2, R3 formed in a semiconductor integrated circuit and capacitors $C_p$ equivalently representing stray capacities between these wirings. FIG. 3B shows how crosstalks due to stray capacities degrade the voltage waveforms of the clock signals. As shown in FIG. 3B, a clock signal R2 undergoes voltage variations under the influence of crosstalks due to stray capacities each time the adjacent clock signals R1 and R3 change their voltage levels. An amount of voltage variation ΔV increases with the stray capacity $C_p$. In clock signals, information at the transition point is important, and therefore, crosstalk near the transition point has great effects on precision of the clock signals.

To generate high-speed and small-amplitude serial signals, it is necessary to use multiphase clock signals having high frequencies. The use of multiphase clock signals having increased frequencies, however, results in that the phase difference $t_0$ between the multiphase clock signals as shown in FIG. 3B becomes shorter, which in turn makes a transition waveform of the clock signal R2 more likely to be degraded by voltage variations due to the crosstalk induced when the adjacent clock signals R1 and R3 perform voltage level transitions. It is therefore desired that the circuit for generating high-speed and small-amplitude serial signals be designed to have as small stray capacities $C_p$ as possible.

Figure 4A:
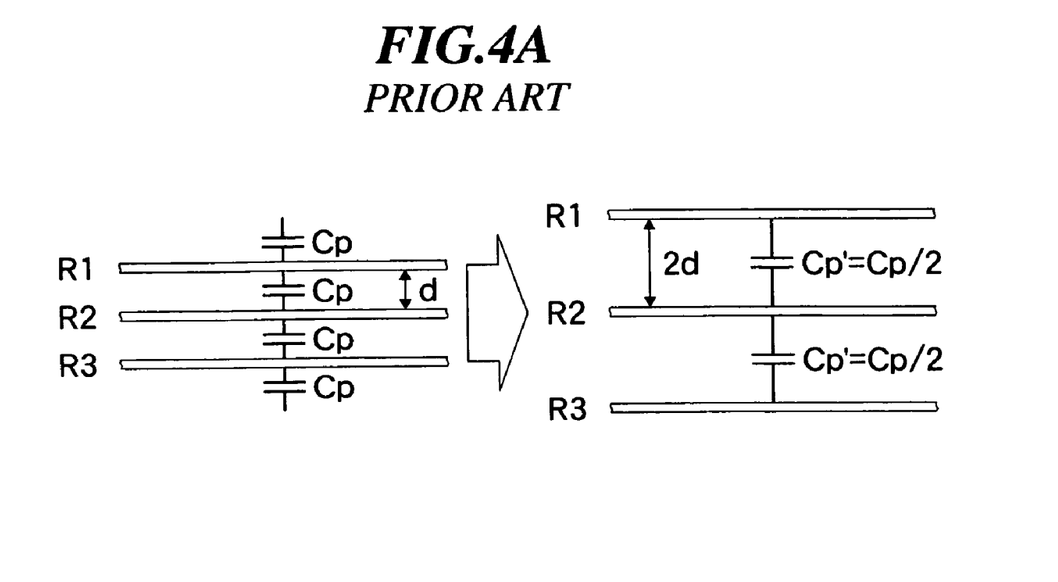
FIGS. 4A and 4B show wirings in the conventional semiconductor integrated circuit which are modified to prevent degradations of waveforms of the multiphase clock signals.

The stray capacities $C_p$ can be reduced, for example, by increasing the distance between the multiphase clock signal wirings as shown in FIG. 4A. FIG. 4A shows an example in which an interval of the multiphase clock signal wirings is increased by two times to halve the stray capacities. This method, however, increases a wiring area for the multiphase clock signals.

Figure 4B:
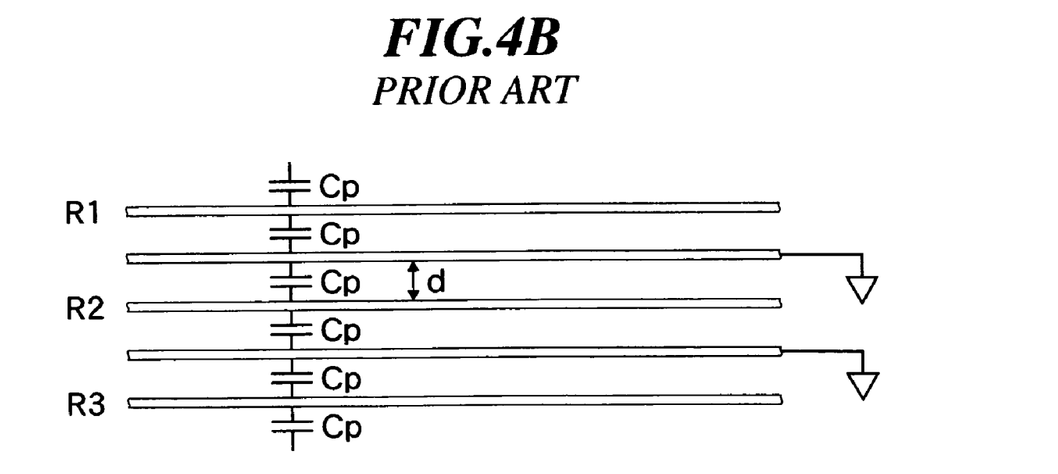

Another technique for reducing the electrostatic coupling between adjacent two clock signal wirings may involve arranging another wiring between the adjacent two clock signal wirings as shown in FIG. 4B. FIG. 4B shows the new wiring added between adjacent two clock signal wirings and the new wiring is grounded. Alternatively, the new wiring may be supplied with a stable voltage. Such a technique can shield the adjacent two clock signal wirings electrostatically from one another and prevent possible degradations of clock signal waveforms which would otherwise be caused by level transitions of the adjacent clock signals. This technique, however, requires an additional area for laying the new wirings, increasing the wiring area for the multiphase clock signals.

On the other hand, a number of multiphase clock signals having the same phase difference tends to increase at an accelerating rate in the future for a higher-speed serial communication. Hence, arranging wirings for the multiphase clock signals using the above-mentioned conventional technique requires a large wiring area, giving rise to a problem of an increased semiconductor substrate area. Under these circumstances, there are growing demands for a semiconductor integrated circuit that can prevent degradation of waveforms of multiphase clock signals without increasing the wiring area.

DISCLOSURE OF THE INVENTION

It is therefore an object of the present invention to provide a semiconductor integrated circuit that can prevent multiphase clock signals having the same phase difference, which signals are generated by a multi-stage differential ring oscillator and transmitted to other circuits, from being degraded in waveform due to electrostatic coupling between wirings thereof and that enables the multiphase clock signals to be wired in as small an area as possible.

To achieve the above object, a semiconductor integrated circuit according to the present invention comprises: multiple stages of amplifier circuits, connected in a ring form, for performing oscillating operation; a logic circuit for performing logic operation on the basis of predetermined ones of output signals of the multiple stages of amplifier circuits to output a plurality of clock signals having different phases from each other and duties not equal to 0.5; and a plurality of wirings for transmitting the plurality of clock signals output from the logic circuit.

According to the present invention, it is possible to prevent degradations of multiphase clock signal waveforms due to stray capacities without increasing the wiring area of the multiphase clock signals.

BRIEF DESCRIPTION OF THE DRAWINGS

Advantages and features of the present invention will become apparent when taken in conjunction with the following detailed description and the accompanying drawings. In these drawings, the same reference number represents identical constitutional elements.

BEST MODE FOR CARRYING OUT THE INVENTION

Figure 5:
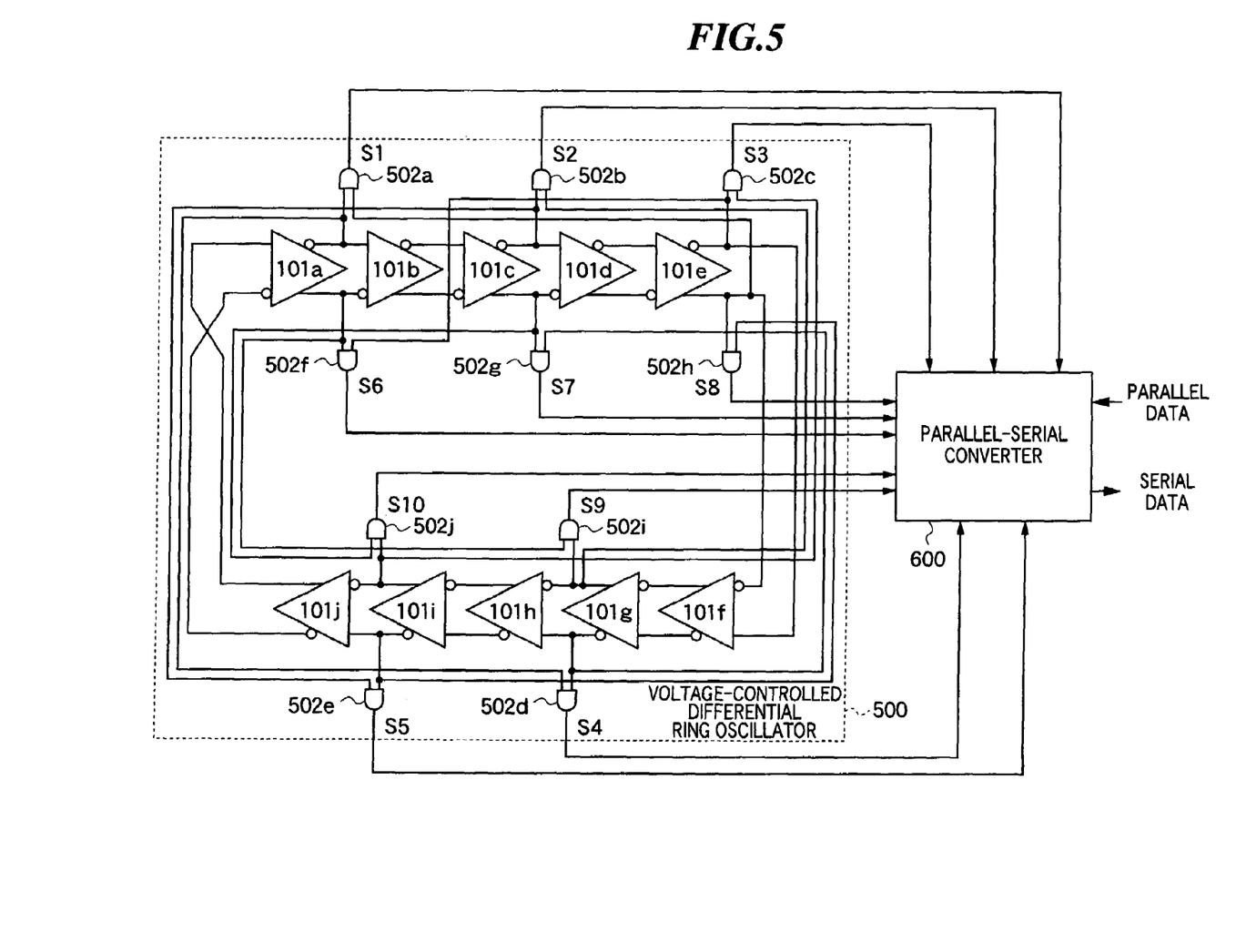
FIG. 5 shows a configuration of a semiconductor integrated circuit according to a first embodiment of the present invention.

FIG. 5 shows a configuration of a semiconductor integrated circuit according to a first embodiment of the present invention. As shown in FIG. 5, this semiconductor integrated circuit includes a voltage-controlled differential ring oscillator 500 for outputting multiphase clock signals and a parallel-serial converter 600 for converting received parallel data into serial data on the basis of the multiphase clock signals. The parallel-serial converter 600 may be provided on the outside of the semiconductor integrated circuit.

The voltage-controlled differential ring oscillator 500 includes N stages of delayed differential inverted amplifiers 101a, 101b, . . . for performing oscillating operation and logic circuits 502a, 502b, . . . for performing logic operation on the basis of output signals of the delayed differential inverted amplifiers 101a, 101b, . . . to output clock signals having M phases. Generally, it is preferred that N is a positive even number and M is an even number within a range from 2 to N. Here, we will take a case of N=M=10 for example.

Each of the delayed differential inverted amplifiers 101a–101j amplifies a difference between a signal applied to a non-inverted input terminal and a signal applied to an inverted input terminal and supplies the amplified differential signal to a non-inverted output terminal and an inverted output terminal. The delayed differential inverted amplifiers 101a–101j are connected in a ring form so that a non-inverted output terminal of the previous stage is connected to an inverted input terminal of the subsequent stage and an inverted output terminal of the previous stage is connected to a non-inverted input terminal of the subsequent stage. It is noted, however, that a non-inverted output terminal of a delayed differential inverted amplifier 101j is connected to a non-inverted input terminal of a delayed differential inverted amplifier 101a and that an inverted output terminal of the delayed differential inverted amplifier 101j is connected to an inverted input terminal of the delayed differential inverted amplifier 101a. With this arrangement, a signal phase is inverted after passing through the ring once. The delay time of each of the delayed differential inverted amplifiers 101a–101j is controlled by an applied control voltage or control current, allowing the oscillation frequency of the voltage-controlled differential ring oscillator 500 to be adjusted.

In this embodiment, the logic circuits include M AND gates 502a–502j. An AND gate 502a has one input terminal connected to the inverted output terminal of the delayed differential inverted amplifier 101a and the other input terminal connected to the non-inverted output terminal of the delayed differential inverted amplifier 101e. One input terminal of an AND gate 502b is connected to the inverted output terminal of the delayed differential inverted amplifier 101c and the other input terminal is connected to the non-inverted output terminal of the delayed differential inverted amplifier 101g. The subsequent AND gates 502c–502j are connected in the similar manner. Thus, the AND gates 502a–502j produce multiphase clock signals S1–S10 as shown in FIG. 6.

Figure 6:
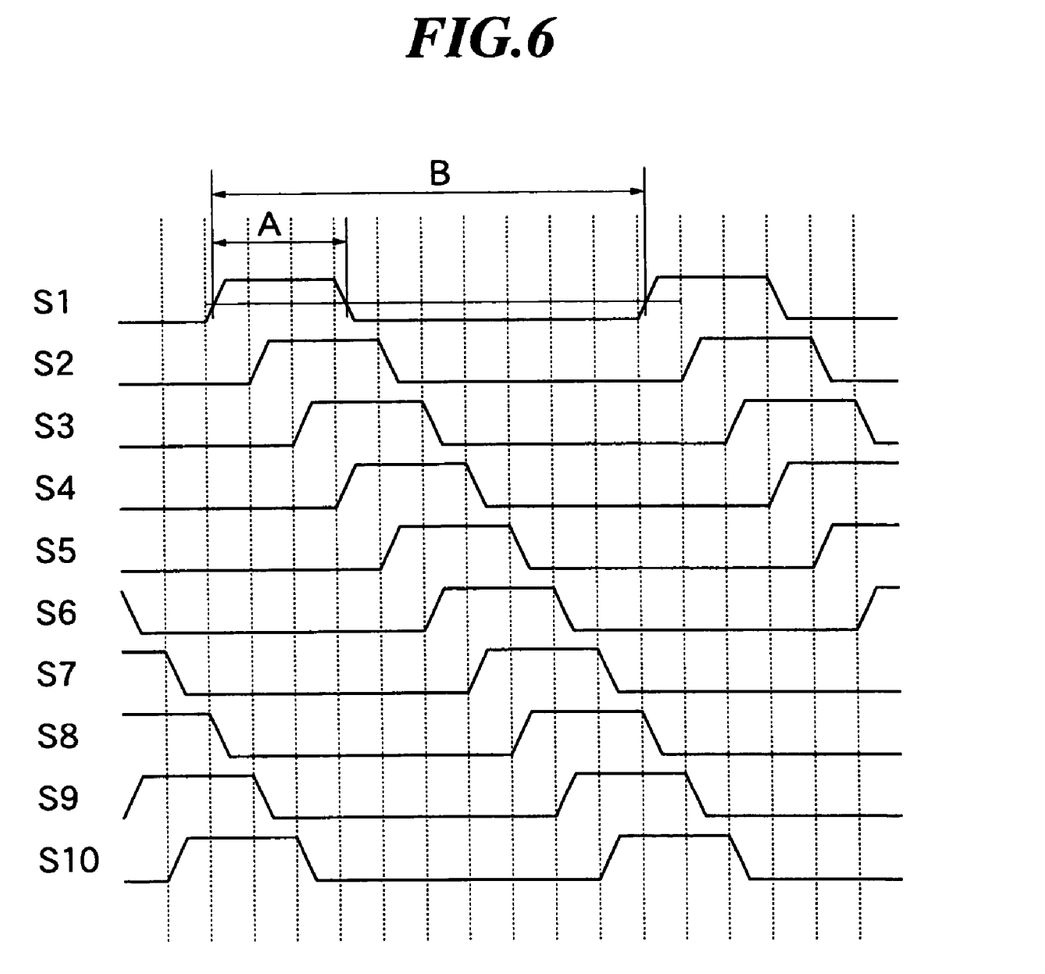
FIG. 6 is a waveform diagram showing voltage waveforms of multiphase clock signals output from a voltage-controlled differential ring oscillator as shown in FIG. 5.

In FIG. 6, when a duration in which the clock signal is high is denoted as "A" and a cycle of the clock signal as "B", then a duty of the clock signal D=A/B is expressed as follows:

$$D=(0.5-2/N) \quad (1)$$

If N=10, equation (1) results in D=0.3<0.5. Hence, two clock signal wirings can be combined such that one clock signal transits from a low level to a high level or from the high level to the low level when another clock signal is maintained at the low level (in this embodiment, ground potential). In this embodiment, sets of combined clock signal wirings (S1, S6), (S2, S7), (S3, S8), (S4, S9), and (S5, S10) are used.

Figure 7A:
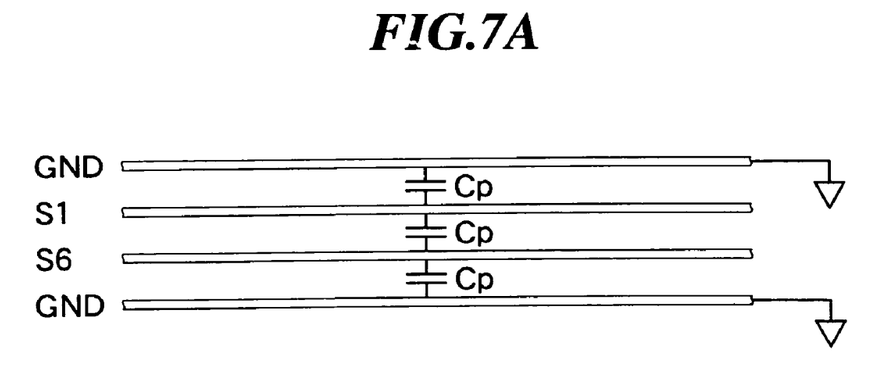
FIG. 7A shows an example arrangement of wirings in the semiconductor integrated circuit according to the first embodiment of the present invention.
Figure 7B:
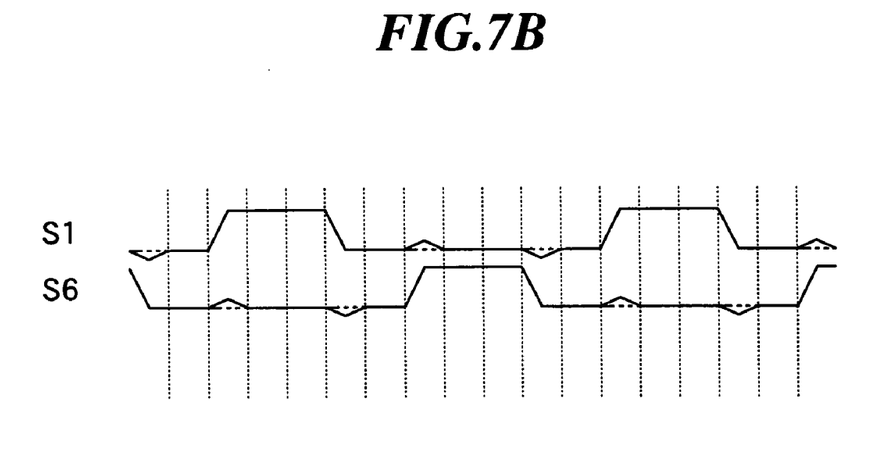
FIG. 7B shows voltage waveforms of clock signals in the example arrangement of wirings as shown in FIG. 7A.

Among the above sets of clock signal wirings, a set of clock signal wirings (S1, S6) is shown in FIG. 7A as an example of wiring arrangement. In FIG. 7A, a wiring for a clock signal S1 and a wiring for a clock signal S6 are arranged in parallel on a semiconductor substrate. On the outside of these wirings, ground wirings GND are arranged for electrostatic shielding. FIG. 7B shows voltage waveforms of the clock signals S1 and S6 in the wiring arrangement as shown in FIG. 7A.

As described above, the set of clock signal wirings (S1, S6) is so arranged that one clock signal changes its level when another clock signal is maintained at a low level (at a ground voltage level). The clock signal wiring at the ground voltage level has a sufficiently small impedance compared with an impedance of a crosstalk source, and therefore, it has a function of electrostatic shield in the same way as a ground wiring GND. For example, when the clock signal S6 has the ground voltage level, a wiring for the clock signal S1 is shielded by a ground wiring GND and a wiring for the clock signal S6. Therefore, as shown in FIG. 7B, if the clock signal S1 changes its level in this period, its waveform is protected against being deformed at that time.

Similarly, as to other sets of clock signal wirings, in a period when one of the two clock signal wirings is at a low level, the other of the two clock signal wirings is virtually shielded. Therefore, by arranging clock signal wirings with ground wirings for shielding every set of clock signal wirings as described above, it is possible to prevent waveform deformations of multiphase clock signals that would otherwise be caused by electrostatic coupling between the wirings.

Figure 8A:
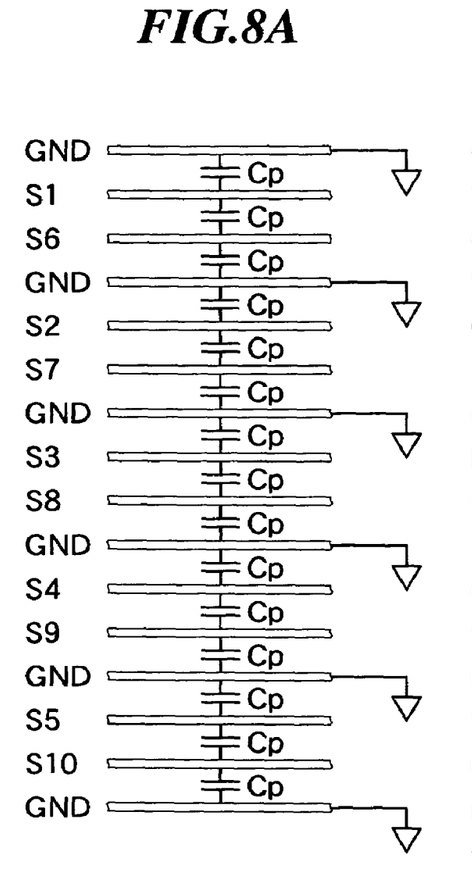
FIG. 8A shows an arrangement of multiphase clock signal wirings in the semiconductor integrated circuit according to the first embodiment of the present invention.
Figure 8B:
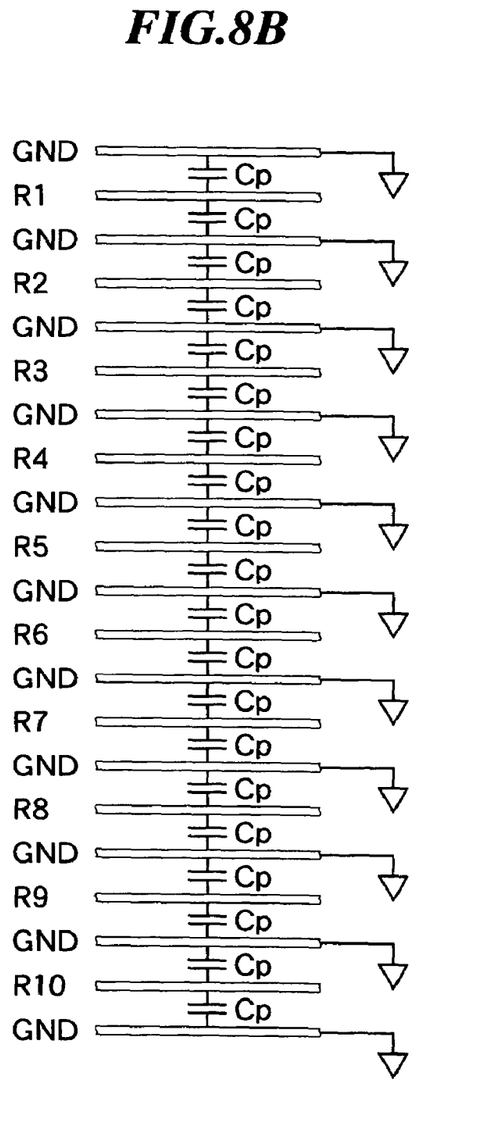
FIG. 8B shows an example arrangement of multiphase clock signal wirings in a conventional semiconductor integrated circuit.

FIG. 8A shows an arrangement of multiphase clock signal wirings according to this embodiment and, for comparison, FIG. 8B shows an example of conventional arrangement of multiphase clock signal wirings. In this embodiment as shown in FIG. 8A, the sets of clock signal wirings (S1, S6), (S2, S7), (S3, S8), (S4, S9) and (S5, S10) each has two clock signal wirings arranged parallel to each other on the semiconductor substrate are arranged with ground wirings GND inserted between respective two sets of clock signal wirings. On the other hand, in the conventional arrangement as shown in FIG. 8B, clock signal wirings R1–R10 and ground wirings GND are alternately arranged on the semiconductor substrate. Comparison between FIG. 8A and FIG. 8B shows that the wiring area of the semiconductor substrate in this embodiment is about 25% less than that in the conventional technique.

Next, a semiconductor integrated circuit according to a second embodiment of the present invention will be described. The second embodiment uses the N-stage voltage-controlled differential ring oscillator as shown in FIG. 5 in a condition of N=12.

Figure 9:
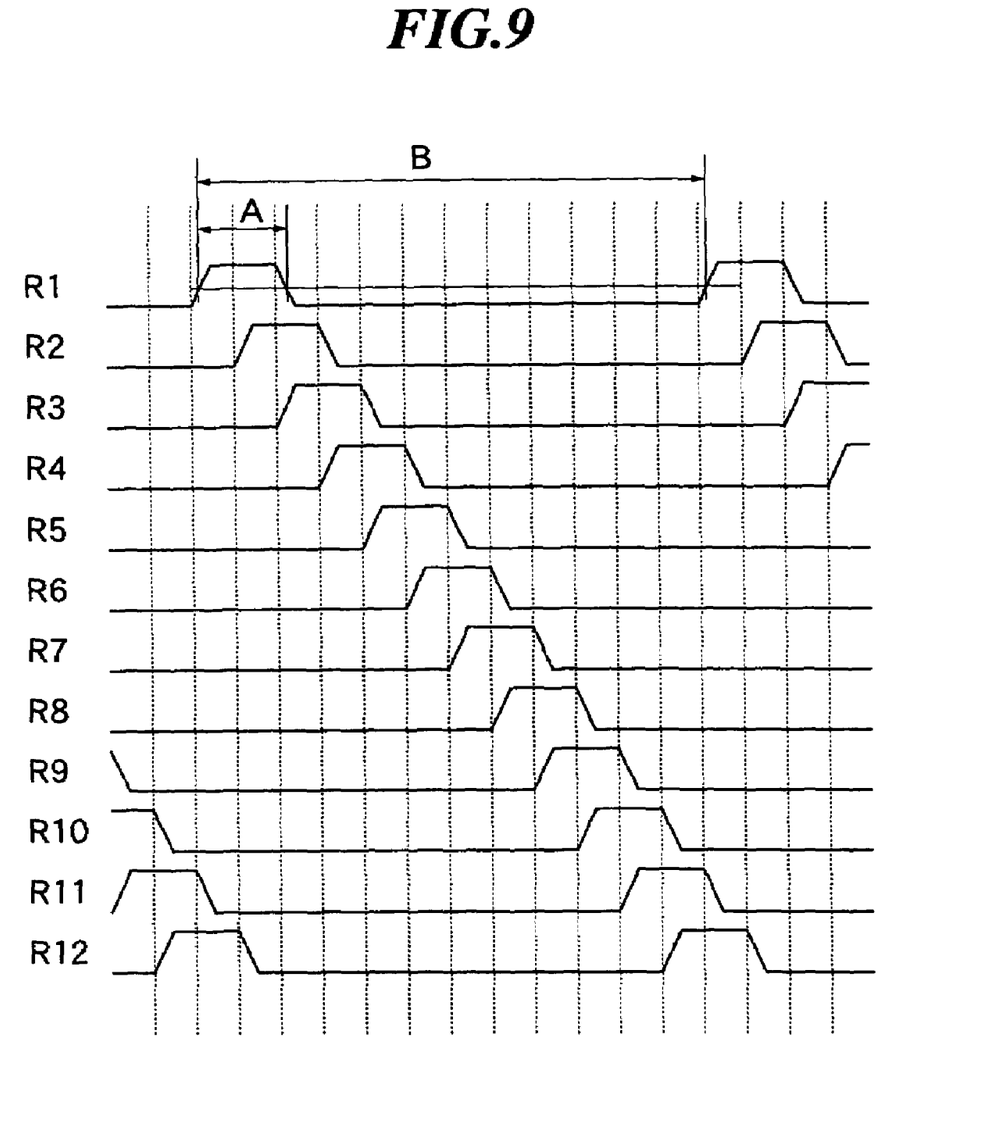
FIG. 9 is a waveform diagram showing voltage waveforms of multiphase clock signals output from a voltage-controlled differential ring oscillator in a semiconductor integrated circuit according to a second embodiment of the present invention.

FIG. 9 shows voltage waveforms of multiphase clock signals S1–S12 output from the 12-stage voltage-controlled differential ring oscillator. In this embodiment, the duty D of each clock signal is obtained from equation (1) as D=0.167. Hence, clock signal wirings are grouped into plural sets of three clock signal wirings and, in each set of three clock signal wirings, it is possible that when one clock signal changes its level, both of the other two clock signals are maintained at a low level. For example, in this embodiment, clock signals are grouped into plural sets of three clock signals by using plural sets of clock signal wirings (S1, S5, S9), (S2, S6, S10), (S3, S7, S11) and (S4, S8, S12). In each set of clock signal wirings, when one of the three clock signals changes its level, the other two clock signals can be certainly maintained at a low level.

Figure 10A:
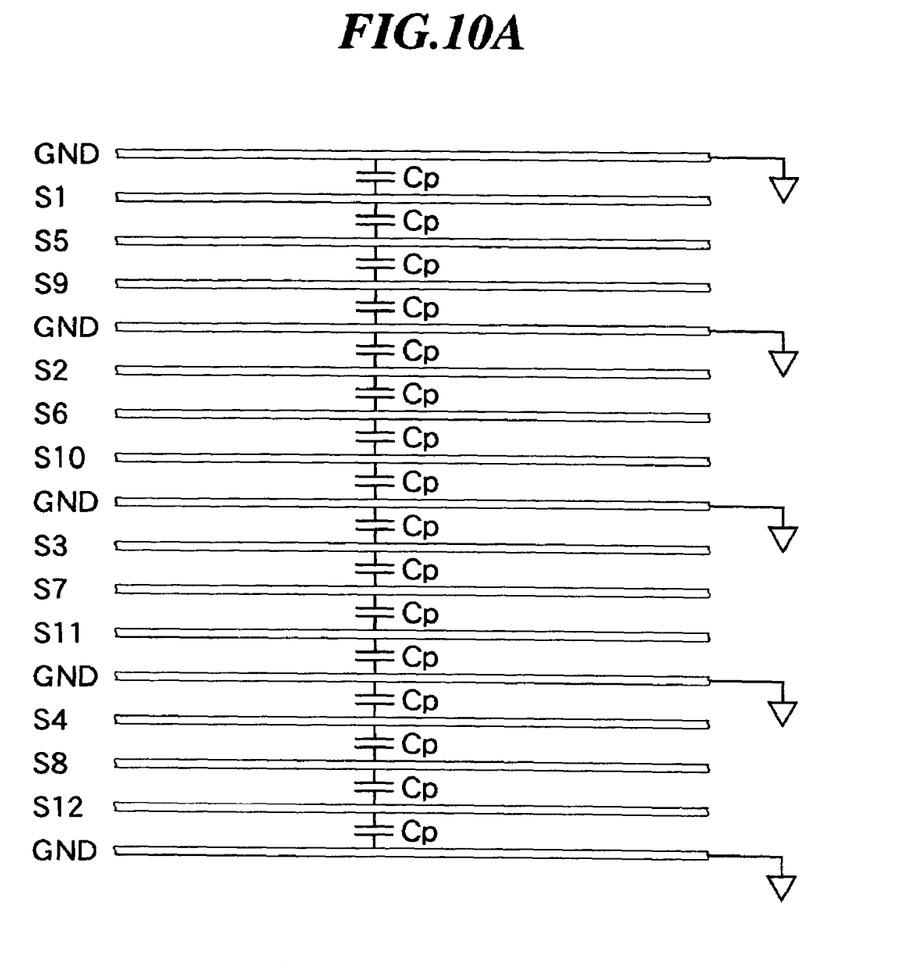
FIG. 10A shows an arrangement of multiphase clock signal wirings in the semiconductor integrated circuit according to the second embodiment of the present invention.

FIG. 10A shows an arrangement of multiphase clock signal wirings in the semiconductor integrated circuit according to this embodiment. As shown in FIG. 10A, in each of the sets of clock signal wirings (S1, S5, S9), (S2, S6, S10), (S3, S7, S11) and (S4, S8, S12), three clock signal wirings are arranged parallel to each other on the semiconductor substrate, with ground wirings GND interposed between respective two sets of clock signal wirings.

Figure 10B:
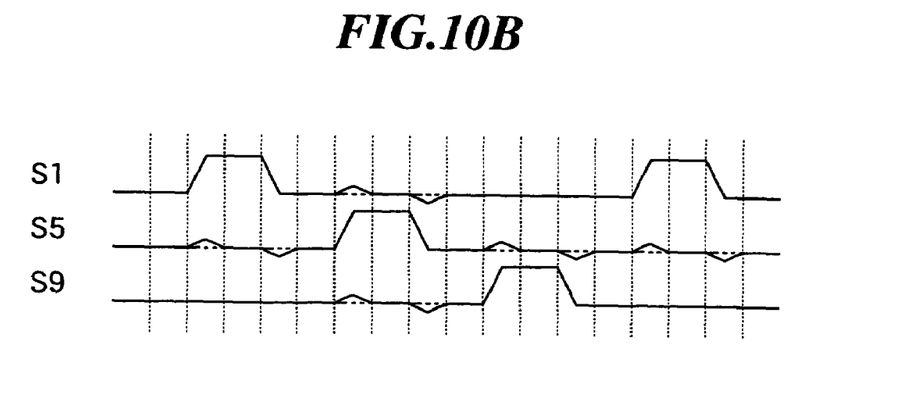
FIG. 10B shows voltage waveforms of the multiphase clock signals in the arrangement as shown in FIG. 10A.

FIG. 10B shows voltage waveforms of clock signals S1, S5, S9 in the semiconductor integrated circuit of this embodiment. As shown in FIG. 10B, when the clock signal S5 performs a voltage level transition, the clock signals S1 and S9 are certainly maintained at a low level. Therefore, the wiring for the clock signal S5 is virtually shielded by the wirings for the clock signals S1 and S9 and no voltage waveform deformation is observed with the clock signal S5 at that time. Further, when the clock signal S1 or S9 changes its voltage level, the clock signal S5 is certainly maintained at a low level, so that wiring for the clock signal S1 or S9 is virtually shielded by wiring for the clock signal S5 and a ground wiring GND.

As described above, according to this embodiment, the wiring area of the semiconductor substrate can be reduced by approximately 36% compared with that of the conventional arrangement in which clock signal wirings and ground wirings are alternately arranged.

Next, a semiconductor integrated circuit according to a third embodiment of the present invention will be described. The third embodiment uses the N-stage voltage-controlled differential ring oscillator as shown in FIG. 5 in a condition of N=16.

Figure 11:
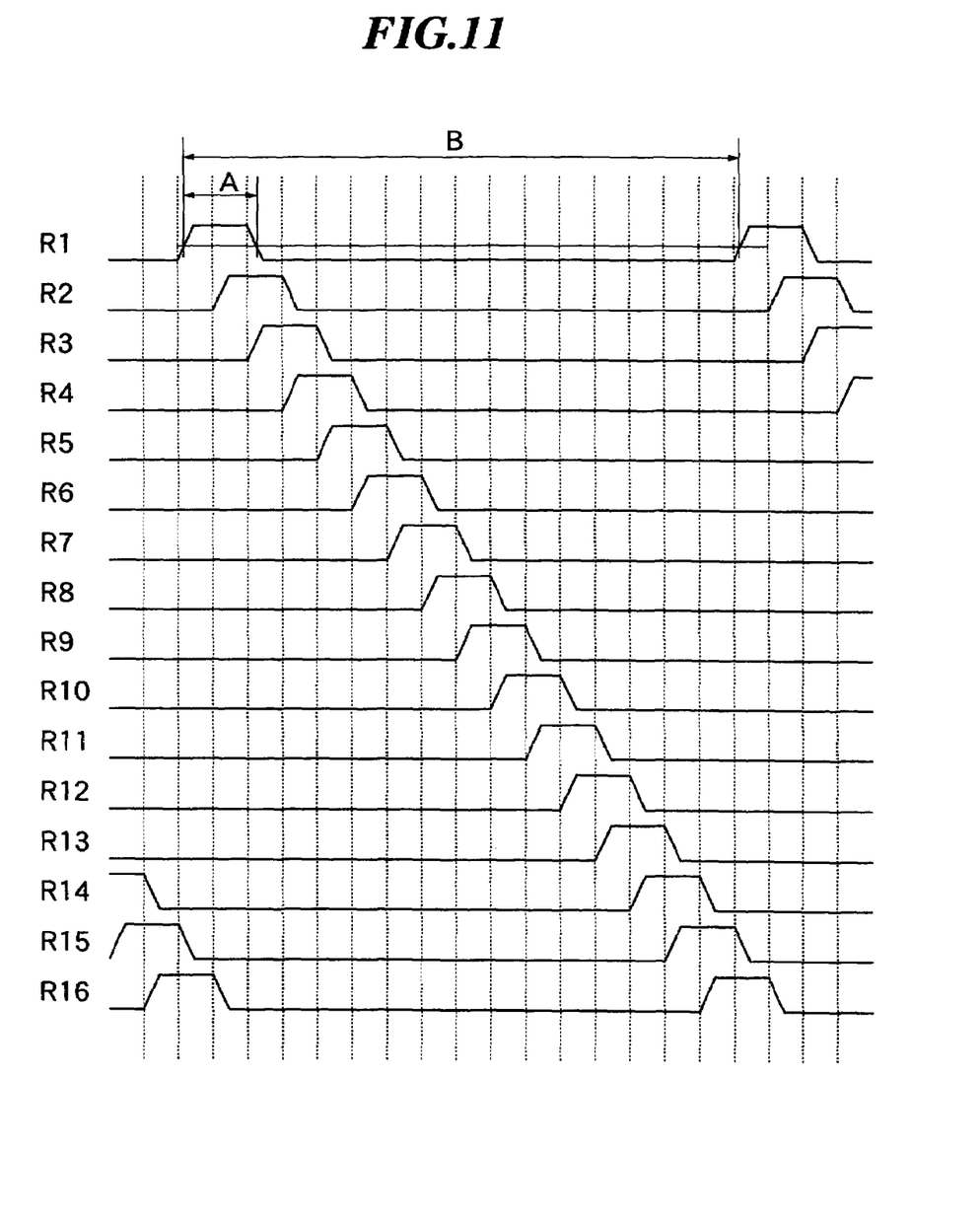
FIG. 11 is a waveform diagram showing voltage waveforms of multiphase clock signals output from a voltage-controlled differential ring oscillator in a semiconductor integrated circuit according to a third embodiment of the present invention.

FIG. 11 shows voltage waveforms of multiphase clock signals S1–S16 output from the 16-stage voltage-controlled differential ring oscillator. In this embodiment, the duty D of each clock signal is obtained from equation (1) as D=0.125. Hence, clock signal wirings are grouped into plural sets of four clock signal wirings and, in each set of four clock signal wirings, it is possible that when one clock signal changes its level, the remaining three clock signals are maintained at a low level. For example, in this embodiment, clock signals are grouped into plural sets of four clock signals by using plural sets of four clock signal wirings (S1, S5, S9, S13), (S2, S6, S10, S14), (S3, S7, S11, S15) and (S4, S8, S12, S16).

Figure 12A:
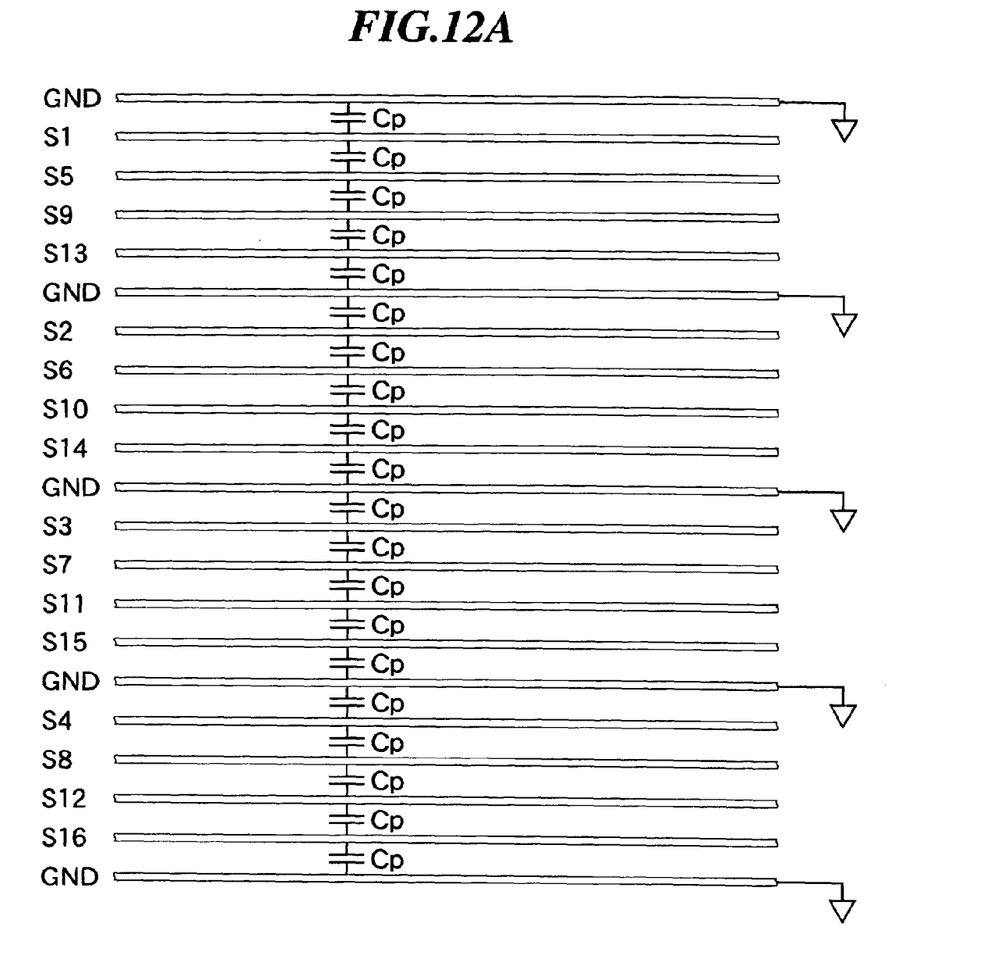
FIG. 12A shows an arrangement of multiphase clock signal wirings in the semiconductor integrated circuit according to the third embodiment of the present invention.

FIG. 12A shows an arrangement of multiphase clock signal wirings in the semiconductor integrated circuit according to this embodiment. As shown in FIG. 12A, in each set of clock signal wirings (S1, S5, S9, S13), (S2, S6, S10, S14), (S3, S7, S11, S15) and (S4, S8, S12, S16), four clock signal wirings are arranged parallel to each other on the semiconductor substrate, with ground wirings GND interposed between respective two sets of clock signal wirings.

Figure 12B:
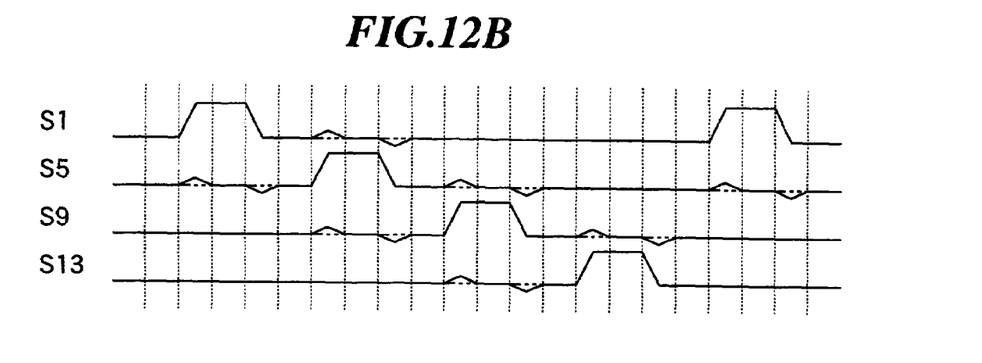
FIG. 12B shows voltage waveforms of the multiphase clock signals in the wiring arrangement as shown in FIG. 12A.

FIG. 12B shows voltage waveforms of clock signals S1, S5, S9, S13 in the semiconductor integrated circuit according to this embodiment. As shown in FIG. 12B, when one of the clock signals in each set performs a voltage level transition, the remaining three clock signals are certainly maintained at a low level. Therefore, wiring of the level-changing clock signal is virtually shielded by wirings of the adjacent clock signal wirings and no voltage waveform deformation is observed with the level-changing clock signal at that time.

As described above, according to this embodiment, the wiring area of the semiconductor substrate can be reduced by approximately 37% compared with that of the conventional arrangement in which clock signal wirings and ground wirings are alternately arranged.

Although a ground wiring for electrostatic shielding is arranged between respective two set of clock signal wirings as a technique for preventing degradation of signals due to electrostatic coupling between respective two sets of clock signal wirings in the above embodiments, a technique for preventing degradation of signals between respective two sets of clock signal wirings is not limited to this arrangement. The present invention can also be realized by employing other techniques. An example of such techniques involves increasing a distance between respective two sets of clock signal wirings to reduce stray capacities between adjacent two sets of clock signal wirings.

Although the voltage-controlled differential ring oscillator has been employed in the above embodiments, the present invention can be applied to and implemented by any oscillator as long as it generates multiphase clock signals having the same phase difference. Thus, the present invention is not limited to the voltage-controlled differential ring oscillator and can be modified within a scope of claims.

According to the present invention, it is possible to prevent degradations of signal waveforms due to electrostatic coupling between multiphase clock signal wirings while reducing the wiring area of a semiconductor substrate for the multiphase clock signal wirings.

INDUSTRIAL APPLICABILITY

The present invention can be applied to semiconductor integrated circuits having a multi-stage ring oscillator that generates multiphase clock signals having the same phase difference.

The invention claimed is:

1. A semiconductor integrated circuit comprising:
N stages of amplifier circuits, connected in a ring form, for performing oscillating operation; where N is an integer not smaller than 2;
a logic circuit for performing logic operation on the basis of predetermined ones of output signals of said N stages of amplifier circuits to output N clock signals having different phases from each other and duties not equal to 0.5; and
a plurality of wirings for transmitting said N clock signals output from said logic circuit.

2. A semiconductor integrated circuit according to claim 1, further comprising a parallel-serial conversion circuit for converting input parallel data into serial data on the basis of said N clock signals.

3. A semiconductor integrated circuit according to claim 1, wherein each of said N stages of amplifier circuits amplifies a difference between a signal applied to a non-inverted input terminal and a signal applied to an inverted input terminal and supplies a differential signal thus obtained to a non-inverted output terminal and an inverted output terminal.

4. A semiconductor integrated circuit according to claim 1, wherein a delay time of each of said multiple N stages of amplifier circuits is controlled by one of a control voltage and a control current.

5. A semiconductor integrated circuit according to claim 1, wherein said N stages of amplifier circuits include an even number of stages of differential circuits.

6. A semiconductor integrated circuit according to claim 5, wherein said logic circuit includes N AND gates, each obtaining logical multiply of two of the output signals of said N stages of amplifier circuits to output one clock signal.

7. A semiconductor integrated circuit comprising:
N stages of amplifier circuits, connected in a ring form, for performing oscillating operation, where N is an integer not smaller than 2;
a logic circuit for performing logic operation on the basis of predetermined ones of output signals of said N stages of amplifier circuits to output N clock signals having different phases from each other and duties not equal to 0.5;
a plurality of wirings for transmitting said N clock signals output from said logic circuit; and
a first wiring and a second wiring arranged parallel to each other, said first wiring undergoing voltage transition between a first voltage and a second voltage when said second wiring has the second voltage.

8. A semiconductor integrated circuit according to claim 7, wherein said second voltage is a ground voltage.

9. A semiconductor integrated circuit comprising:
N stages of amplifier circuits, connected in a ring form, for performing oscillating operation, where N is an integer not smaller than 2;
a logic circuit for performing logic operation on the basis of predetermined ones of output signals of said N stages of amplifier circuits to output N clock signals having different phases from each other and duties not equal to 0.5;
a plurality of wirings for transmitting said N clock signals output from said logic circuit; and
a first wiring and at least one wiring together forming a set of wirings, said first wiring undergoing voltage transition between a first voltage and a second voltage when said at least one wiring has the second voltage, a distance between a wiring included in said set and a wiring not included in said set being larger than a distance between two adjacent wirings included in said set.

10. A semiconductor integrated circuit according to claim 9, wherein said second voltage is a ground voltage.

11. A semiconductor integrated circuit according to claim 9, wherein another wiring is arranged between said wiring included in said set and said wiring not included in said set.

12. A semiconductor integrated circuit according to claim 10, wherein said another wiring is grounded.

13. A semiconductor integrated circuit comprising:
N stages of amplifier circuits, connected in a ring form, for performing oscillating operation, where N is an integer not smaller than 2;
a logic circuit for performing logic operation on the basis of predetermined ones of output signals of said N stages of amplifier circuits to output N clock signals having different phases from each other and duties not larger than (0.5–2/N); and a plurality of wirings for transmitting said N clock signals output from said logic circuit.

14. A semiconductor integrated circuit according to claim 13, wherein said logic circuit includes N AND gates, each obtaining logical multiply of two of the output signals of said N stages of amplifier circuits to output one clock signal.

15. A semiconductor integrated circuit according to claim 13, wherein a first wiring and a second wiring are arranged parallel to each other and said first wiring undergoes voltage transition between a first voltage and a second voltage when said second wiring has the second voltage.

16. A semiconductor integrated circuit according to claim 15, wherein said second voltage is a ground voltage.

17. A multiphase clock generating circuit comprising:

multiple stages of amplifier circuits, connected in a ring form, for performing oscillating operation;

a logic circuit for generating plural groups of clock signals having different phases from each other on the basis of predetermined ones of output signals of said multiple stages of amplifier circuits, said logic circuit causing voltage transition in one of clock signals included in each of said plural groups when another of clock signals included in said group has a low level;

a plurality of wirings for transmitting said plural groups of clock signals output from said logic circuit; and at least one wiring arranged between wirings for transmitting one group of clock signals and wirings for transmitting another group of clock signals, said at least one wiring being connected to a ground voltage line.

18. A multiphase clock generating circuit comprising:

multiple stages of amplifier circuits, connected in a ring form, for performing oscillating operation;

a logic circuit for generating plural groups of clock signals having different phases from each other on the basis of predetermined ones of output signals of said multiple stages of amplifier circuits, said logic circuit causing voltage transition in one of clock signals included in each of said plural groups when another of clock signals included in said group has a low level;

a plurality of wirings for transmitting said plural groups of clock signals output from said logic circuit; and wirings arranged at both sides of said wirings for transmitting said plural groups of clock signals, said wirings being connected to a ground voltage line.

* * * * *